United States Patent [19]

Kamon

[11] Patent Number: 5,229,230
[45] Date of Patent: Jul. 20, 1993

[54] PHOTOMASK
[75] Inventor: Kazuya Kamon, Itami, Japan
[73] Assignee: Mitsubishi Denki Kabushiki Kaisha, Tokyo, Japan
[21] Appl. No.: 717,061
[22] Filed: Jun. 18, 1991
[30] Foreign Application Priority Data Dec. 18, 1990 [JP] Japan .................. 2-403043

[51] Int. Cl.⁵ .............................. G03F 9/00
[52] U.S. Cl. ........................ 430/5; 430/321; 430/325
[58] Field of Search ............ 430/5, 321, 325
[56] References Cited

U.S. PATENT DOCUMENTS 4,764,441  8/1988  Ohta et al. ................ 430/5
4,777,116 10/1988  Kawatsuki et al. ........ 430/325
5,045,417  9/1991  Okamoto ................... 430/5

FOREIGN PATENT DOCUMENTS 1190082  7/1985  Canada .
62-67514  3/1987  Japan .

OTHER PUBLICATIONS

Pat. Abstract 83-790097/42, Levenson, Image Resolution of Photolithographic Transmission Mask..., 1983.

Primary Examiner—Marion E. McCamish
Assistant Examiner—Mark A. Chapman
Attorney, Agent, or Firm—Oblon, Spivak, McClelland, Maier & Neustadt

[57] ABSTRACT

In a photomask, a rectangular pattern to be transferred to a resist film and a plurality of auxiliary patterns are provided in a light shielding layer which is formed on a transparent plate. The auxiliary patterns are spaced from the rectangular light-transmission pattern so that the Fresnel diffraction light from the auxiliary patterns and the zero-order diffraction light from the rectangular light-transmission pattern intensify each other at a position where a pattern corresponding to the rectangular light-transmission pattern is formed on the resist film. Thus, the light intensity of the pattern on the resist film is increased.

10 Claims, 17 Drawing Sheets

F I G. 1
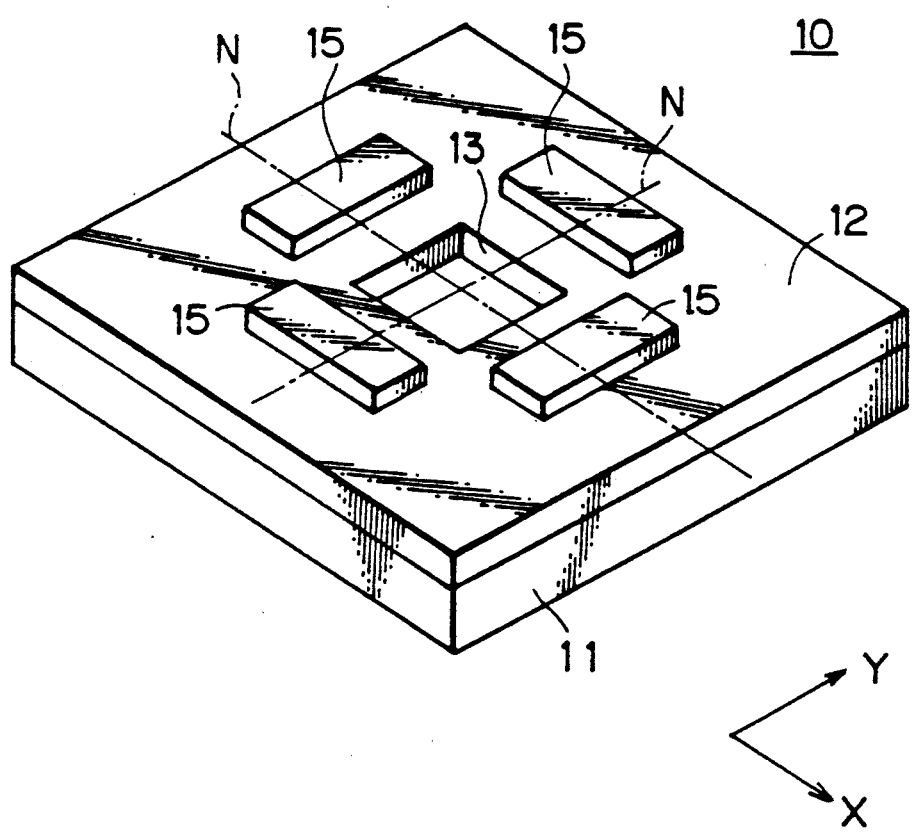

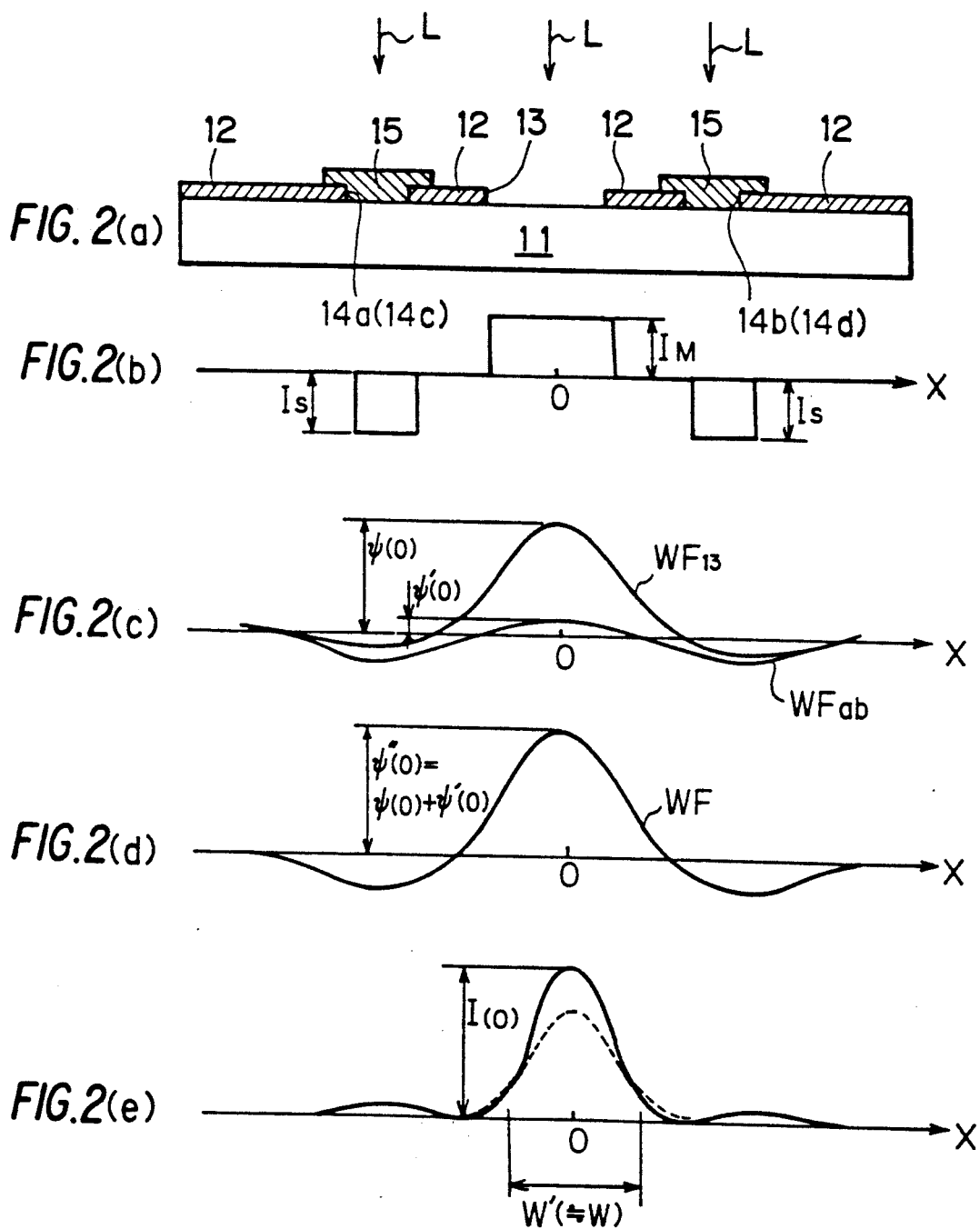

PHOTOMASK

BACKGROUND OF THE INVENTION

1. Field of the Invention

The present invention relates to a photomask for use in transferring a predetermined rectangular pattern to a resist film through of a lithography technique.

2. Description of the Background Art

A lithography technique is usually used for forming a circuit pattern in the process of manufacturing a semiconductor device. The technique fundamentally comprises a coating step for coating a substrate such as wafer with photoresist, an exposure step for impinging light from a suitable light source (e.g., light in an ultraviolet region) upon a photomask having a predetermined pattern to transfer the pattern to the photoresist, and a development step for developing the photoresist to provide the photoresist having the predetermined pattern.

FIG. 10 is a perspective view of the major part of a conventional photomask 70 for use in the exposure step of the lithography. In FIG. 10, reference numeral 71 designates a glass substrate, on which a light shielding layer 72 made of chromium and the like is formed. The light shielding layer 72 is provided with a main pattern 73 which is, for example, rectangular. The main pattern 73 is formed in the shape similar to the pattern to be transferred to the photoresist. The term "rectangular" means a shape including a square and an oblong.

FIG. 11 is a schematic view of an exposing device. The exposing device comprises a light source 81 for emitting light in the ultraviolet region downwardly. Light L from the light source 81 is directed through a lens 82 to the photomask 70 of FIG. 10. Some of the incident light L passing through the rectangular main pattern 73 is introduced to a photoresist surface 84 through a lens 83. The light L incident on the light shielding layer 72 is shielded by the light shielding layer 72. Thus, a pattern corresponding to the main pattern 73 (hereinafter referred to as a "transferred pattern") is transferred to the photoresist surface 84.

FIG. 12 is a graph showing light intensity distribution on the photoresist surface 84. The graph of FIG. 12 was derived from the main pattern 73, 0.4 μm square. The abscissa denotes a distance from a point O, being the center of the transferred pattern, in the X direction (of FIG. 10), while the ordinate denotes a relative light intensity where the intensity at whole image exposure is taken as "1". The term "whole image exposure" refers to the exposure of the photoresist surface 84 through a photomask formed of the glass substrate 71 only.

A profile of the light intensity around the main peak shows Gaussian type distribution. That is, the light intensity is decreased gradually and continuously as the distance from the point O is increased. In particular, when the light intensity is low at the point O and varies moderately, the shape of the rectangular pattern transferred to the photoresist surface 84 is not sharp at the edges thereof. As a result, it is difficult to reproduce the transferred pattern corresponding to the main pattern 73 to the photoresist surface 84 faithfully. A photomask having only a main pattern for a contact hole conventionally has the above-mentioned problem.

SUMMARY OF THE INVENTION

The present invention is directed to a photomask for use within transferring a predetermined rectangular pattern to a resist film through a lithography technique. The photomask comprises: a transparent plate; and a light shielding layer formed on the transparent plate, the light shielding layer being provided with a rectangular light-transmission pattern corresponding to a rectangular pattern to be transferred to a resist film and a plurality of auxiliary patterns, wherein the auxiliary patterns are spaced from the rectangular light-transmission pattern so that the Fresnel diffraction light from the auxiliary patterns and the zero-order diffraction light from the rectangular light-transmission pattern intensify each other at a position where a pattern corresponding to the rectangular light-transmission pattern is formed on the resist film.

According to the photomask of the present invention, the auxiliary patterns are spaced from the rectangular light-transmission pattern around the same so that the Fresnel diffraction light from the auxiliary patterns and the zero-order diffraction light from the rectangular light-transmission pattern intensify each other at the position where the pattern corresponding to the rectangular light-transmission pattern is formed on the resist film. Therefore, while the pattern is transferred on the resist film in a substantially intact form, the light intensity of the pattern on the resist film is increased, and the shape of the pattern grows sharp at the edges thereof. As a result, the pattern corresponding to the rectangular light-transmission pattern can be transferred to the resist film with high accuracy.

An object of the present invention is to provide a photomask which is capable of transferring a pattern corresponding to a rectangular light-transmission pattern thereof to a resist film with high accuracy.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a perspective view of a photomask according to a preferred embodiment of the present invention;

FIG. 2 illustrates the function of the photomask of FIG. 1;

DESCRIPTION OF THE PREFERRED EMBODIMENTS

Figure 3A:
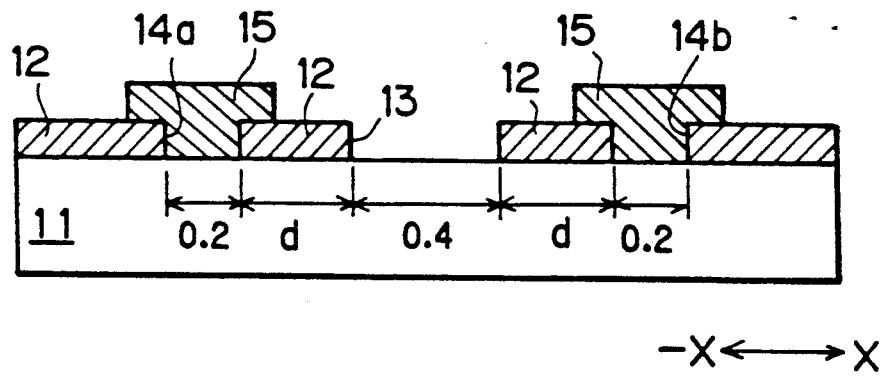
FIGS. 3A and 3B show simulation conditions.

FIG. 1 is a perspective view of a photomask according to a preferred embodiment of the present invention. FIG. 2 illustrates the function of the photomask of FIG. 1. As shown in FIGS. 1 and 2(a), a photomask 10 comprises a light shielding layer 12 formed on a glass substrate 11. The light shielding layer 12 is provided with a main pattern 13 disposed substantially at the center of the light shielding layer 12 and auxiliary patterns 14a to 14d. The auxiliary patterns 14a to 14d are spaced a predetermined distance apart from the main pattern 13 on the normal lines N of the respective sides of the main pattern 13, respectively. A manner of setting the distance between the respective auxiliary patterns 14a to 14d and the main pattern 13 is described later. The auxiliary patterns 14a to 14d are filled with phase shift members 15 made of $SiO_2$ and the like. The phase shift members 15 are transparent or translucent. When the phase shift members 15 transmit light L, the phase of the transmitted light is shifted by 180° relative to the light L.

Figure 11:
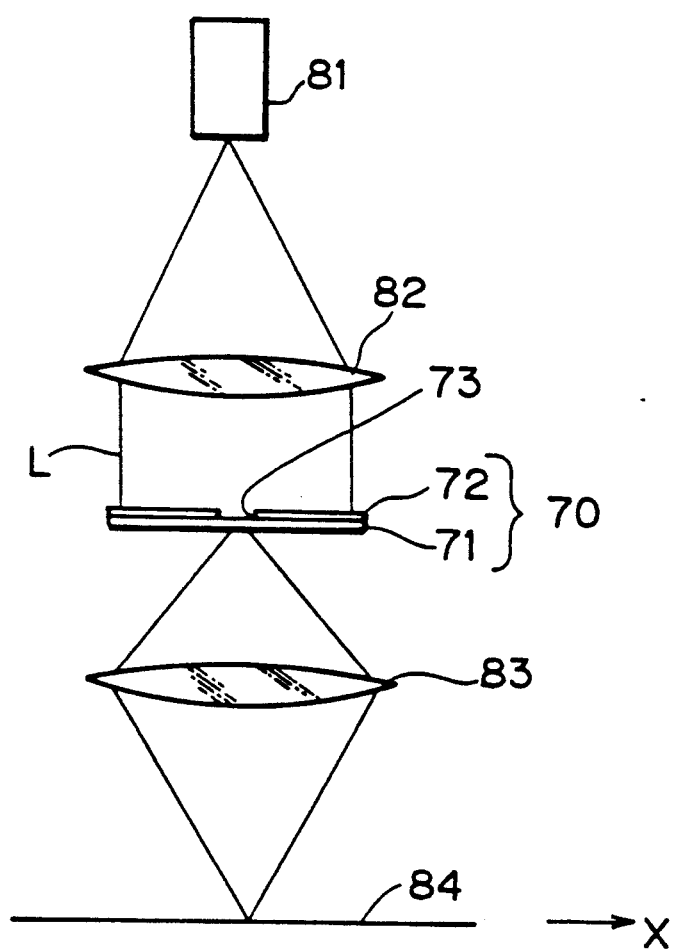
FIG. 11 is a schematic view of an exposing device.

When the photomask 10 is installed in the exposing device of FIG. 11 and then the light source 81 turns on, light L from the light source 81 passes through the lens 82 and impinges on the photomask 10. Immediately under the photomask 10, the light is introduced only to the regions corresponding to the main pattern 13 and the auxiliary patterns 14a to 14d, as shown in FIG. 2(b). The phase of the light passing through the phase shift members 15 is shifted by 180° relative to the incident light L. Thus, the phase of the light passing through the main pattern 13 and that of the light passing through the phase shift members 15 and the auxiliary patterns 14a to 14d are shifted from each other by 180°.

The light from the photomask 10 impings through the lens 83 upon the photoresist surface 84, so that an optical image corresponding to the main pattern 13 is transferred to the photoresist surface 84.

A waveform $WF_{13}$ in FIG. 2(c) indicates an amplitude $\phi(X)$ of the optical image of the main pattern 13 on the photoresist surface 84. A waveform $WF_{ab}$ indicates a composite amplitude $\phi'(X)$ of the optical images of the auxiliary patterns 14a and 14b. The distance between the respective auxiliary patterns 14a and 14b and the main pattern 13 is set so that the waveforms $WF_{13}$ and $WF_{ab}$ intensify each other at a point O (the center of the transferred pattern). This allows the amplitudes $\phi(0)$ and $\phi'(0)$ at the point O to have the same sign ($>0$). The waveforms $WF_{13}$ and $WF_{ab}$ may intensify each other at the point O by the adjustment of the size of the auxiliary patterns 14a and 14b in place of the adjustment of the distance. The problem described below arises with the photomask 10 formed with the auxiliary patterns 14a and 14b which are larger than the main pattern 13 in size.

The photomask 10 is provided with the auxiliary patterns 14a and 14b, and thereby the optical images corresponding to the auxiliary patterns 14a and 14b (hereinafter referred to as "sub-patterns") are transferred to the photoresist surface 84, respectively. The sub-patterns are unnecessary and must be removed in the lithography step. However, the light intensity of the sub-patterns on the photoresist surface 84 is low when the size of the auxiliary patterns 14a and 14b is much smaller than that of the main pattern 13. There is no particular problem of the sub-patterns in the actual lithography step. If the size of the auxiliary patterns 14a and 14b is substantially equal to or larger than that of the main pattern 13, the light intensity of the sub-patterns transferred to the photoresist surface 84 is substantially equal to or larger than that of the transferred main pattern. Therefore, it is necessary, in the present invention, to achieve the photomask in which the size of the auxiliary patterns 14a and 14b is much smaller than that of the main pattern 13. For example, when the main pattern 13 is 0.4 μm × 0.4 μm in size, the auxiliary patterns 14a and 14b are required to be around 0.2 μm × 0.4 μm or less in size.

FIG. 2(d) shows an amplitude $\phi''(X)$ of the light actually illuminating the photoresist surface 84 (hereinafter referred to as "illuminating light"). The illuminating light is the composite light of the diffraction light from the main pattern 13 and the diffraction lights from the auxiliary patterns 14a and 14b. An waveform WF indicates the amplitude $\phi''(X)$ thereof. The amplitude $\phi''(0)$ at the point O is:

$$\phi''(0) = \phi(0) + \phi'(0)$$

and the absolute value of the amplitude $\phi''(0)$ is larger than that of the amplitude $\phi(0)$.

Accordingly, the light intensity $I(X)$ of the illuminating light is larger than the light intensity of the diffraction light from the main pattern 13 shown by the dotted curve in FIG. 2(e). The width W of the pattern, transferred only with the diffraction light from the main pattern 13, in the X direction is substantially equal to the width W' of the pattern which is transferred with the zero-order diffraction light from the main pattern 13 and the diffraction lights from the auxiliary patterns 14a and 14b. The provision of the auxiliary patterns 14a and 14b at the positions suitably away from the main pattern 13 enables an improvement in the light intensity $I(0)$ at the point O without the change in width of the transferred pattern in the X direction. As a result, the shape of the transferred pattern can be sharp at the edges thereof, and the pattern can be transferred to the photoresist surface 84 with high accuracy. The same result can be attained in the simulation described later.

Hereinabove described is the effect of the provision of the auxiliary patterns 14a and 14b. When the distance between the respective auxiliary patterns 14c and 14d and the main pattern 13 is adjusted in the same manner as mentioned above, the same effect can be achieved. That is, the further provision of the auxiliary patterns 14c and 14d enables a further improvement in the light intensity $I(0)$ at the point O without the change in width of the transferred pattern in the Y direction. It is not essential for the above-mentioned effect to provide the photomask 10 with all of the auxiliary patterns 14a to 14d. The number of auxiliary patterns is arbitrary.

Next described is the relation between the above-mentioned effect and the distance between the auxiliary patterns and the main pattern. For the relation, the following simulation is carried out to examine the etching depth of the photoresist with respect to the light intensity distribution on the photoresist surface 84 and the exposure process thereon.

Figure 3B:
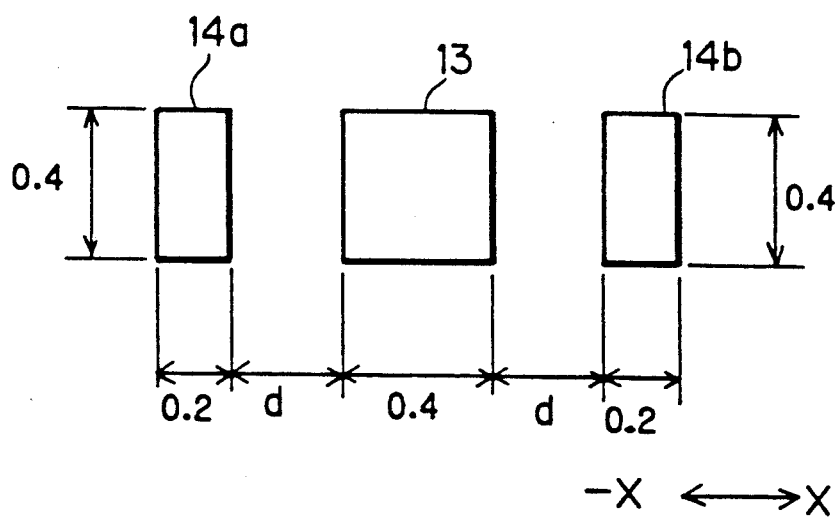
Figure 4A:
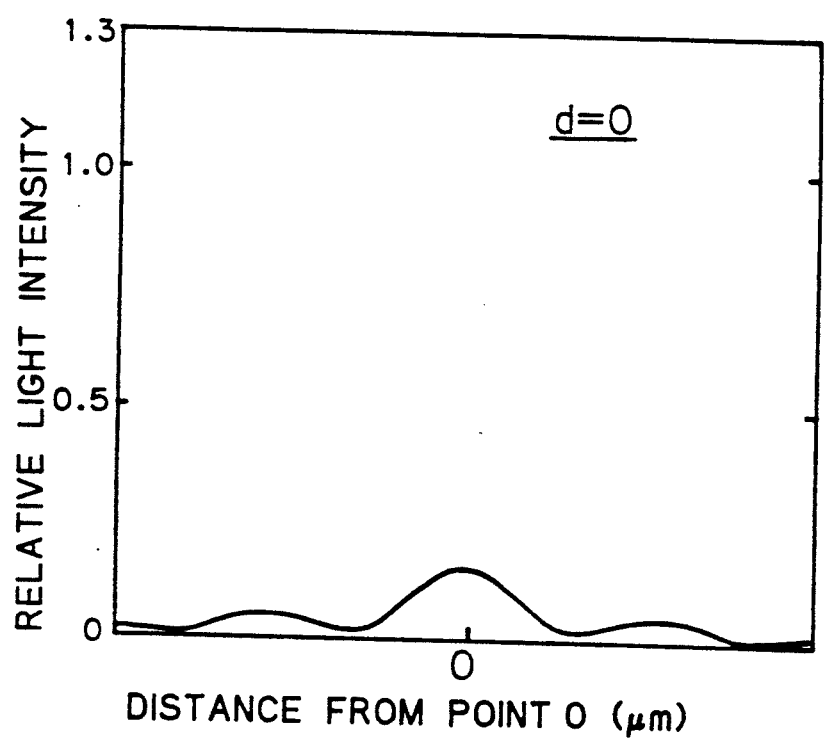
FIGS. 4A, 5A, 6A, 7A and 8A are a graph showing a relative light intensity on a photoresist surface where the distance d is 0, 0.1, 0.2, 0.3 and 0.4 μm, respectively.
Figure 4B:
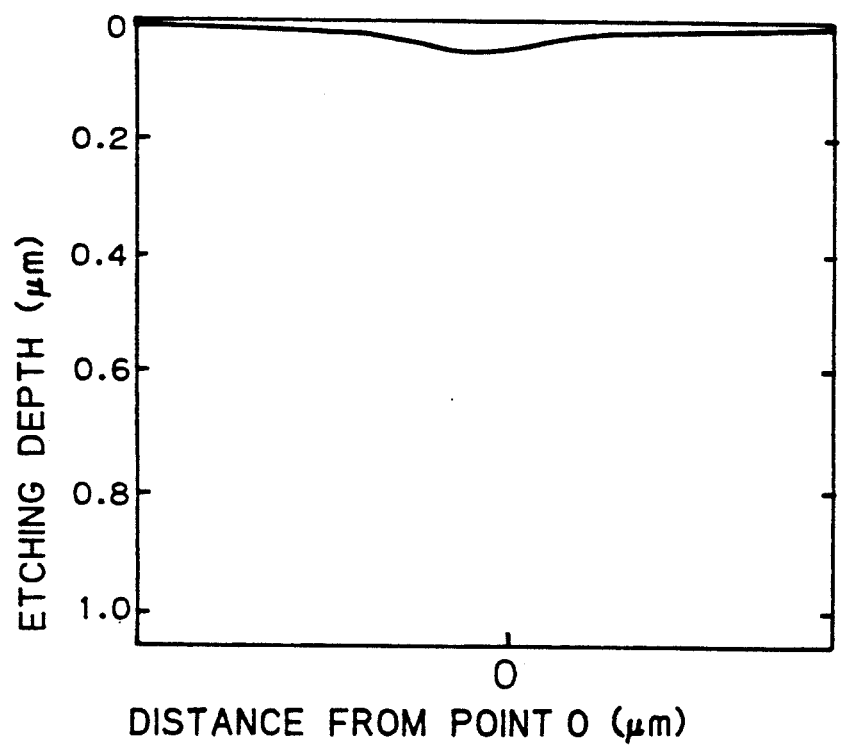
FIGS. 4B, 5B, 6B, 7B and 8B are a graph showing an etching depth where the distance d is 0, 0.1, 0.2, 0.3 and 0.4 μm, respectively.
Figure 5A:
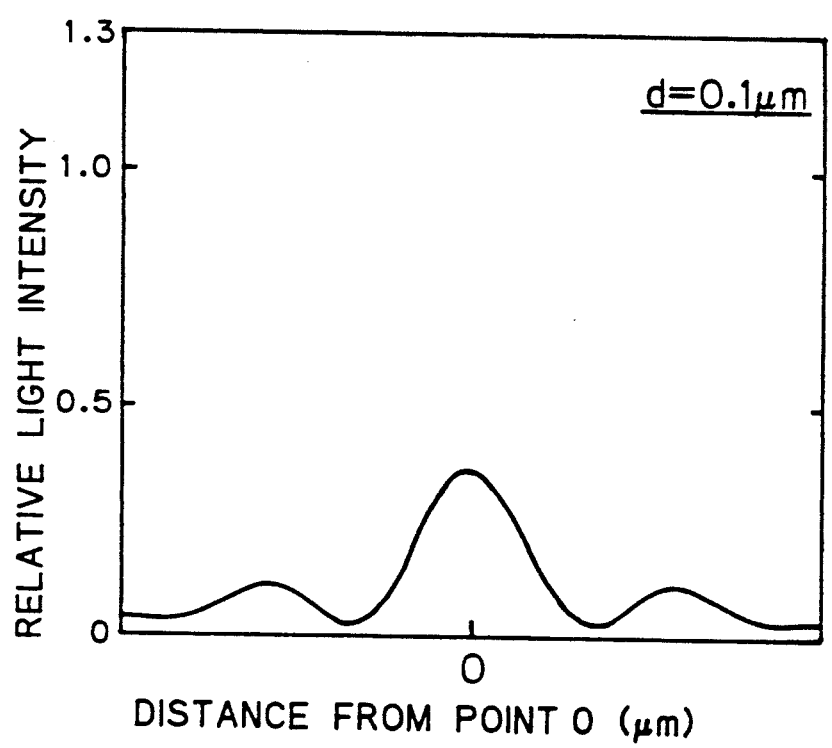
Figure 5B:
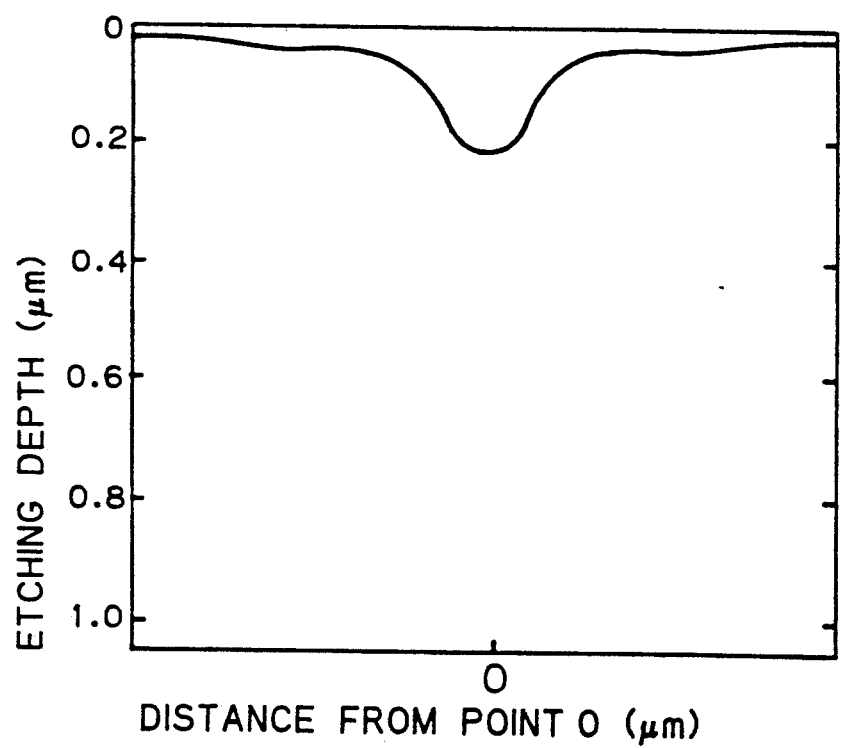
Figure 6A:
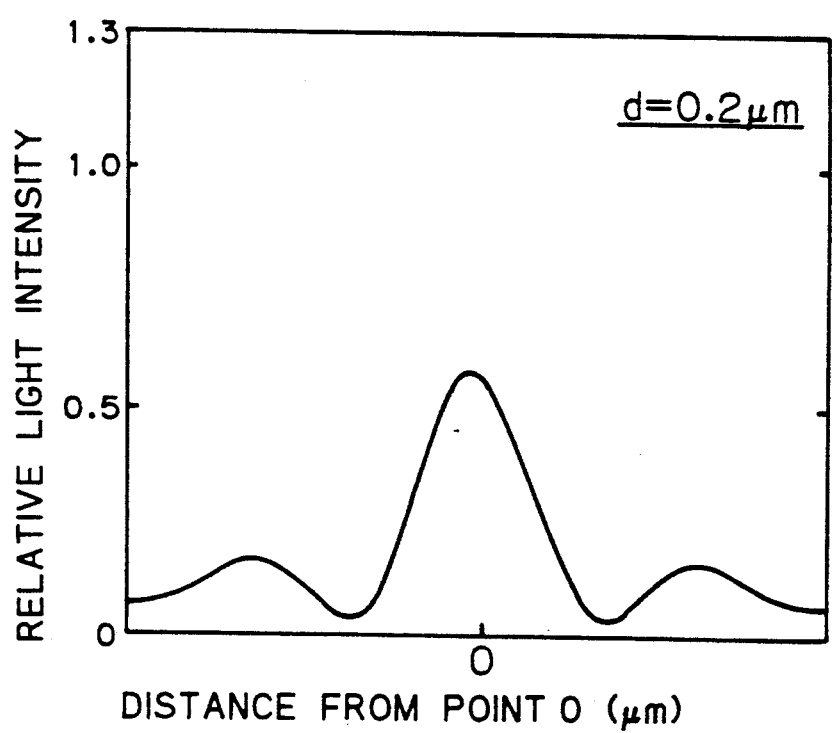
Figure 6B:
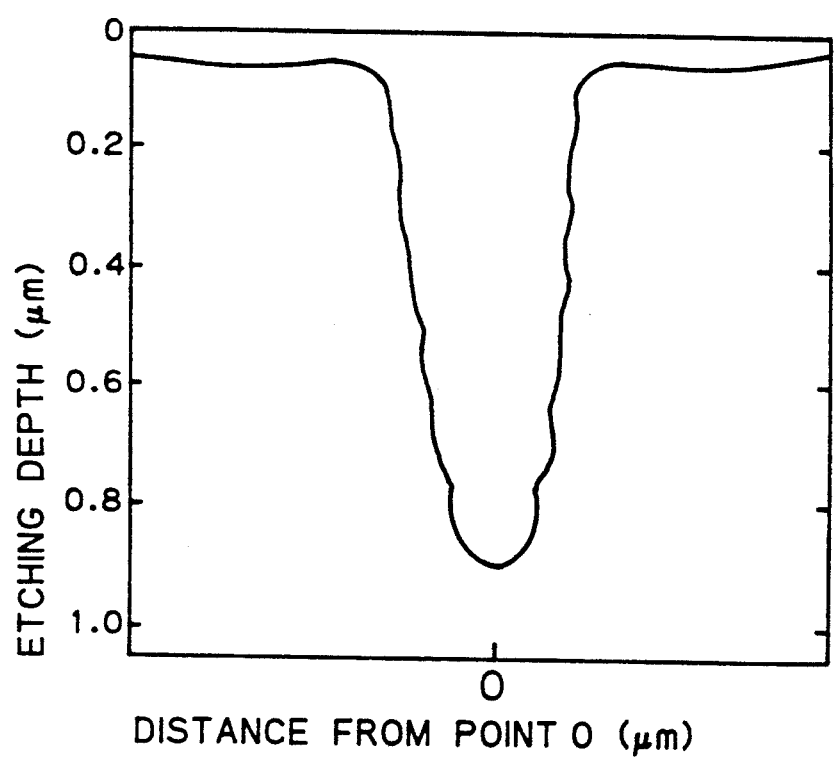
Figure 7A:
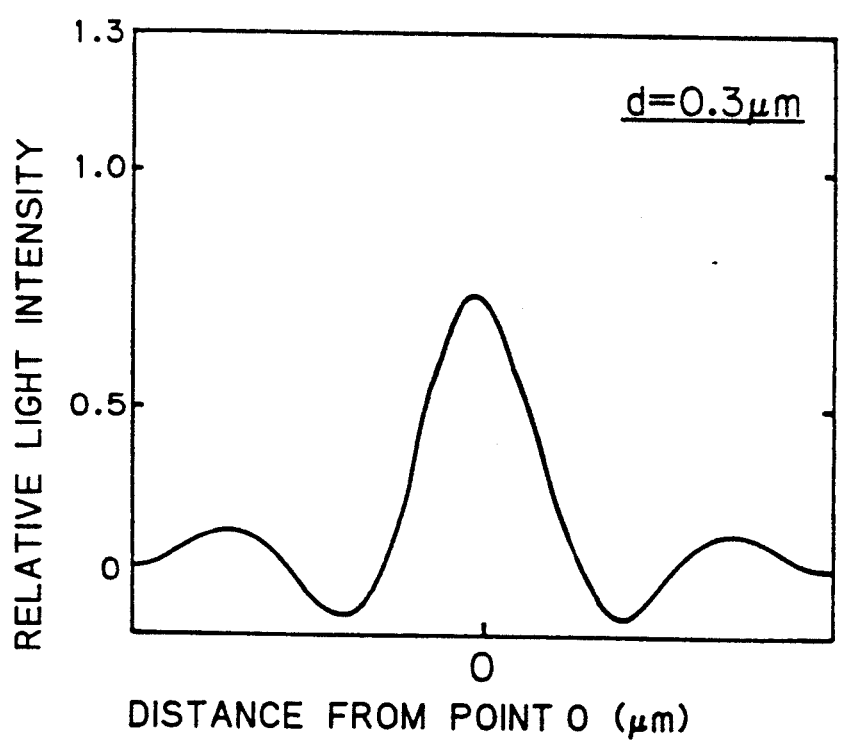
Figure 7B:
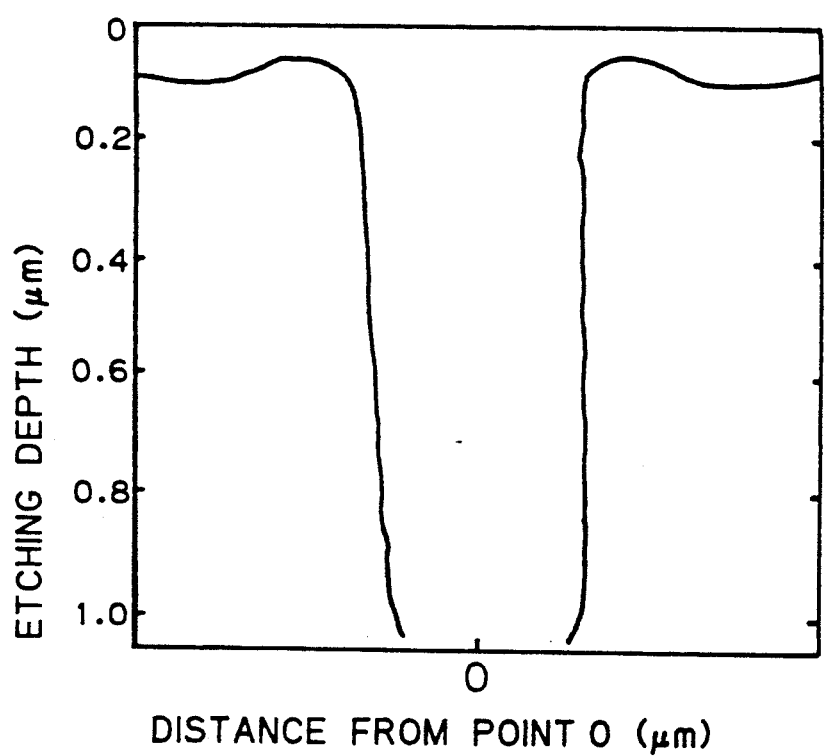

FIGS. 3A and 3B show simulation conditions. The photomask 10 is formed with the 0.4 μm × 0.4 μm main pattern 13 and the 0.2 μm × 0.4 μm auxiliary patterns 14a and 14b. The auxiliary patterns 14a and 14b are spaced a predetermined distance d (= 0, 0.1, 0.2, 0.3 or 0.4 μm) apart from the main pattern 13 in the X and (−X) directions, and are filled with the phase shift members 15. In the exposing device of FIG. 11, the wavelength λ of the light from the light source 81 is 436 nm and the numerical aperture NA of the lens 83 is 0.54.

FIGS. 4A, 5A, 6A, 7A and 8A are a graph showing a relative light intensity on the photoresist surface where the distance d is 0, 0.1, 0.2, 0.3 and 0.4 μm, respectively. FIGS. 4B, 5B, 6B, 7B and 8B are a graph showing an etching depth where the distance d is 0, 0.1, 0.2, 0.3 and 0.4 μm, respectively. The abscissas denote a distance from the center (point O) of the transferred pattern. The ordinates of FIGS. 4A, 5A, 6A, 7A and 8A denote the light intensity relative to the light intensity at the whole image exposure, and the ordinates of FIGS. 4B, 5B, 6B, 7B and 8B denote the etching depth.

As will be found from FIGS. 4A, 5A, 6A, 7A and 8A, the light intensity distribution of the transferred pattern changes largely with the change in the distance d between the auxiliary patterns 14a and 14b and the main pattern 13. The etching depth also changes largely in accordance with the light intensity distribution, as shown in FIGS. 4B, 5B, 6B, 7B and 8B.

Figure 8A:
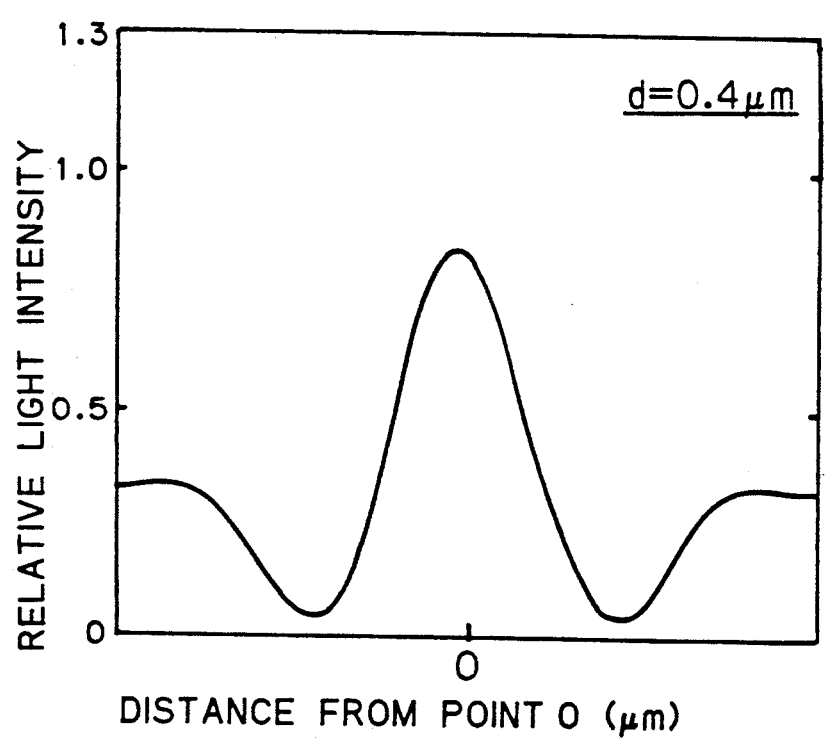
Figure 8B:
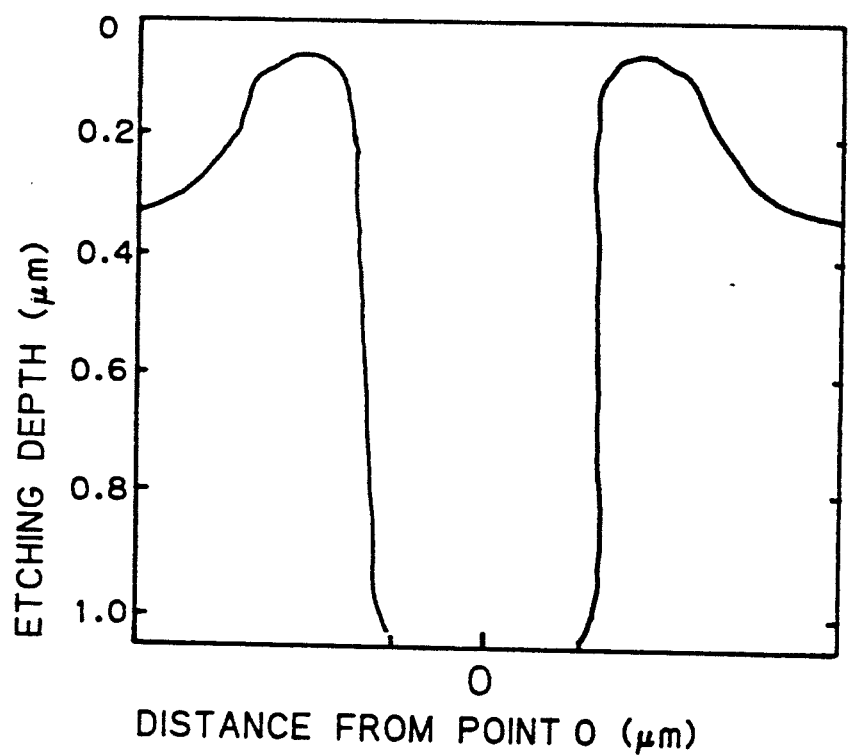
Figure 12:
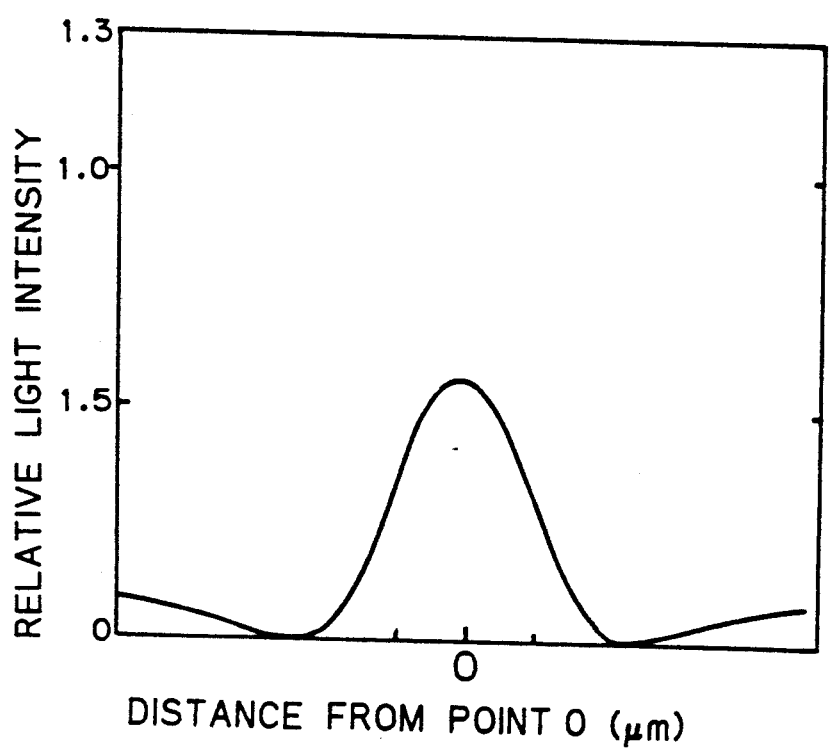
FIG. 12 is a graph showing light intensity distribution on a photoresist surface.

Compared with FIG. 12, it is found that the light intensity at the point O can be increased at the distance d of 0.3 or 0.4 μm without the change in the width of the transferred pattern. Side etchings are, however, caused on the both sides of the transferred pattern at the distance d of 0.4 μm, as shown in FIG. 8B. Therefore, it is found from the simulation that the distance d is most preferably 0.3 μm under the above-mentioned conditions.

For the determination of the optimal conditions for providing the photomask with the auxiliary patterns, the number and size of auxiliary patterns and the like should be appropriately set and the same simulation as described above should be carried out.

In the above-mentioned preferred embodiment, the auxiliary patterns 14a to 14d are filled with the phase shift members 15. This is intended for the contribution of the first-order diffraction light out of the whole diffraction light from the respective auxiliary patterns 14a to 14d to the increase in the light intensity of the transferred pattern. If there are provided no phase shift members 15, the auxiliary patterns 14a to 14d should be spaced from the main pattern 13 so that the second-order diffraction light from the auxiliary patterns substantially coincides with the diffraction light from the main pattern at the point O. This produces the same effect as in the above-mentioned preferred embodiment (in which there are provided phase shift members 15). However, the intensity of the first-order diffraction light is higher than that of the second-order diffraction light. Accordingly, the light intensity of the transferred pattern with the phase shift members 15 is higher than that of the transferred pattern without the phase shift members 15.

Figure 9A:
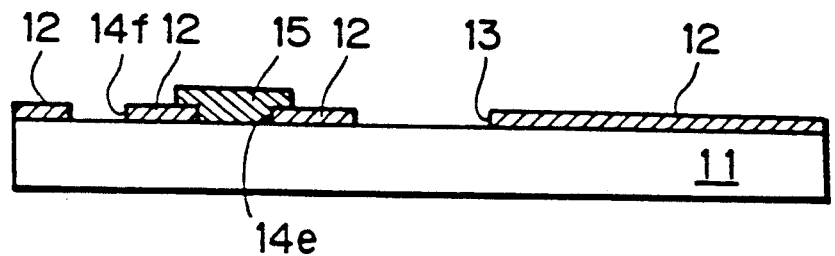
FIG. 9 illustrates the function of a photomask according to another preferred embodiment of the present invention.
Figure 9B:
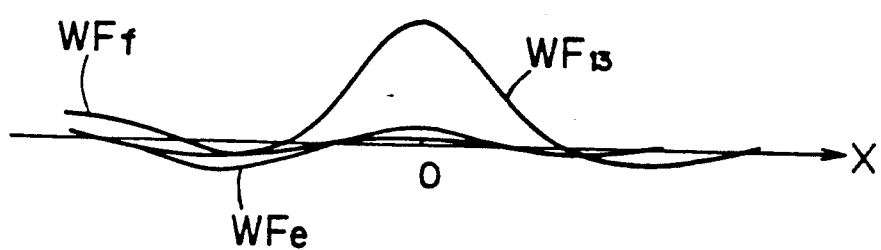
Figure 10:
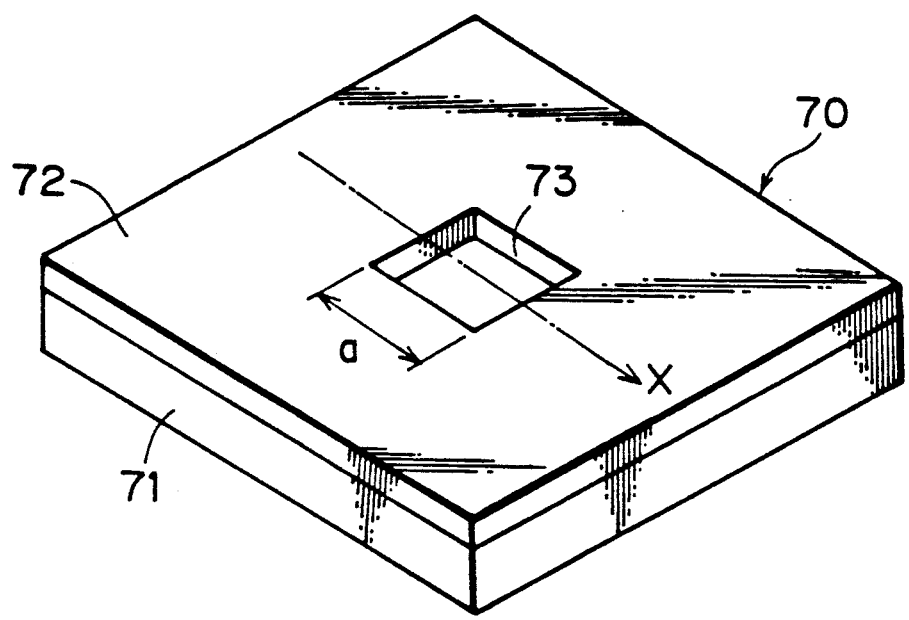
FIG. 10 is a perspective view of a conventional photomask.

With reference to FIG. 9(a), auxiliary patterns 14e and 14f may be arranged serially from the main pattern 13 in the (−X) direction. In this case, the auxiliary pattern 14e is filled with the phase shift members 15, while the auxiliary pattern 14f is not. As shown in FIG. 9(b), the distances between the respective auxiliary patterns 14e and 14f and the main pattern 13 are appropriately set so that waveforms $WF_{13}$, $WF_e$ and $WF_f$ intensify each other at the point O and amplitudes $\phi(0)$, $\phi_e(0)$ and $\phi_f(0)$ at the point O have the same sign. The waveforms $WF_{13}$, $WF_e$ and $WF_f$ indicate the amplitudes $\phi(X)$, $\phi_e(X)$ and $\phi_f(X)$ of the diffraction lights from the main pattern 13 and the auxiliary patterns 14e and 14f, respectively.

According to the photomask having the above-mentioned structure, not only the first-order diffraction light from the auxiliary pattern 14e but also the second-order diffraction light from the auxiliary pattern 14f contribute to the increase in the light intensity of the transferred pattern, and the pattern having a sharper shape can be formed.

Although the present invention has been described and illustrated in detail, it is clearly understood that the same is by way of illustration and example only and is not to be taken by way of limitation. The spirit and scope of the present invention should be limited only by the terms of the appended claims.

What is claimed is:

1. A photomask for use within transferring a predetermined rectangular pattern to a resist film through a lithography technique; said photomask comprising:
   a transparent plate; and
   a light shielding layer formed on said transparent plate, said light shielding layer being provided with a rectangular light-transmission pattern corresponding to a rectangular pattern to be transferred to a resist film and a plurality of auxiliary patterns,
   wherein said auxiliary patterns are spaced from said rectangular light-transmission pattern so that the Fresnel diffraction light from said auxiliary patterns and the zero-order diffraction light from said rectangular light-transmission pattern are added to each other at a position where a pattern corresponding to said rectangular light-transmission pattern is formed on said resist film.

2. A photomask in accordance with claim 1, wherein said auxiliary patterns are located symmetrically with respect to said rectangular light-transmission pattern.

3. A photomask in accordance with claim 2, wherein a phase shift member is filled in each of said auxiliary patterns, said phase shift member shifting the phase of light transmitted said auxiliary patterns.

4. A photomask in accordance with claim 3, wherein each of said auxiliary patterns is smaller than said rectangular light-transmission pattern in size.

5. A photomask in accordance with claim 1, wherein said auxiliary patterns are located on a normal line of sides of said rectangular light-transmission pattern.

6. A photomask for use within transferring a predetermined rectangular pattern to a resist film through a lithography technique; said photomask comprising:
   a transparent plate; and
   a light shielding layer formed on said transparent plate, said light shielding layer being provided with a rectangular light-transmission pattern corresponding to a rectangular pattern to be transferred to a resist film, a first auxiliary pattern, and a second auxiliary pattern,
   wherein said first and second auxiliary patterns are located serially from said rectangular light-transmission pattern.

7. A photomask in accordance with claim 6, wherein said first and second auxiliary patterns are located on a normal line of sides of said rectangular light-transmission pattern.

8. A photomask in accordance with claim 6, wherein said first auxiliary pattern is located so that the first-order diffraction light from said first auxiliary pattern is added to the zero-order diffraction light from said rectangular light-transmission pattern at a position where a pattern corresponding to said rectangular light-transmission pattern is formed on said resist film.

9. A photomask in accordance with claim 8, wherein said second auxiliary pattern is located so that the second-order diffraction light from said second auxiliary pattern is added to the zero-order diffraction light from said rectangular light-transmission pattern at said position.

10. A photomask in accordance with claim 9, wherein a phase shift member is filled in said first auxiliary pattern, said phase shift member shifting the phase of light transmitted said first auxiliary pattern.

* * * * *